(12) United States Patent
Akatsu et al.

(10) Patent No.: US 6,485,894 B1
(45) Date of Patent: Nov. 26, 2002

(54) METHOD TO SELF-ALIGN A LITHOGRAPHIC PATTERN TO A WORKPIECE

(75) Inventors: Hiroyuki Akatsu, Yorktown Heights, NY (US); Franz X. Zach, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 09/675,250

(22) Filed: Sep. 29, 2000

(51) Int. Cl.[7] ................................. G03C 5/56
(52) U.S. Cl. .................. 430/327; 430/313; 430/317; 430/311; 216/40
(58) Field of Search ................. 430/311, 317, 430/327, 313; 216/40

(56) References Cited

U.S. PATENT DOCUMENTS

| | | | |
|---|---|---|---|
| 4,377,028 A | 3/1983 | Imahashi | 29/574 |
| 4,379,833 A * | 4/1983 | Canavello et al. | 427/96 |
| 4,419,013 A | 12/1983 | Heimer | 356/400 |
| 4,779,001 A | 10/1988 | Makosch | 250/548 |
| 4,795,261 A | 1/1989 | Nakata et al. | 250/548 |
| 4,906,852 A | 3/1990 | Nakata et al. | 356/401 |
| 5,153,083 A | 10/1992 | Garofalo et al. | 430/5 |
| 5,725,903 A * | 3/1998 | Rostoker | 427/145 |
| 5,861,320 A | 1/1999 | Shiraishi | 438/16 |
| 6,080,654 A * | 6/2000 | Manchester | 257/374 |

\* cited by examiner

Primary Examiner—Mark F. Huff
Assistant Examiner—Daborah Chacko-Davis
(74) Attorney, Agent, or Firm—Ira D. Blecker

(57) ABSTRACT

A method to self-align a lithographic pattern to a workpiece, the method including the steps of obtaining a workpiece having a predetermined pattern of features; modifying at least some of the features so that when a photoresist material is applied to the pattern, there is a substantial difference in reflectivity between two adjacent features, at least one of which has been modified; applying a photoresist material; masklessly exposing the photoresist material; developing the photoresist material, the substantial difference in reflectivity of the two adjacent features causing the developed photoresist material to reveal one adjacent feature but not the other.

21 Claims, 5 Drawing Sheets

METHOD TO SELF-ALIGN A LITHOGRAPHIC PATTERN TO A WORKPIECE

BACKGROUND OF THE INVENTION

The present invention relates to optical lithography, such as used in the fabrication of semiconductor integrated circuits, and more particularly, to methods to self-align a lithographic pattern to a semiconductor wafer without an exposure mask.

In a typical optical lithography system, optical radiation from an optical source propagates through a mask or reticle onto a photoresist layer located on the top surface of a semiconductor wafer. In this manner, the mask pattern is focused on the photoresist layer. Depending upon whether this photoresist is positive or negative, when it is subjected to a developing process the material of the photoresist is removed or remains at areas where the optical radiation was incident. Thus, the pattern of the mask is transferred to (or printed on) the photoresist. Subsequent etching processes, such as wet etching or dry plasma etching, remove selected portions of the semiconductor wafer or of layers of material located between the top surface of the wafer and the bottom surface of the photoresist layer, or of both the substrate and the layers. Portions of the substrate or of the layers of material thus are removed from the top surface of the wafer underlying areas where the photoresist was removed by the developing process but not underlying areas where the photoresist remains. Thus, the pattern of the mask is transferred to layers of material overlying the semiconductor wafer, as is desired, for example, in the art of semiconductor integrated circuit fabrication.

In fabricating such circuits, it is desirable to have as many devices per wafer as is possible. Hence, it is desirable to have as small a transistor or other feature size as possible.

A critical process step is the alignment of the mask to the semiconductor wafer for printing images on the semiconductor wafer itself or on overlying layers. Errors in the placement of one pattern with respect to another are called overlay errors. For purposes of mask alignment, each mask contains specially designed and placed registration marks which allow the alignment of a subsequent mask. The art is replete with various techniques for mask alignment so as to minimize alignment errors.

Alignment errors can be significant and can amount to as much as 50% of the minimum feature size. As device dimensions become smaller, it is desirable to eliminate mask alignment errors. In this regard, it would be advantageous to develop technology to self-align the pattern to the existing pattern on the semiconductor wafer.

Shiraishi U.S. Pat. No. 5,861,320, the disclosure of which is incorporated by reference herein, discloses an alignment mark on a semiconductor wafer having a recessed or projecting portion as a function of the wavelength used for the alignment of a mask to the semiconductor wafer.

Garofalo et al. U.S. Pat. No. 5,153,083, the disclosure of which is incorporated by reference herein, discloses a method to make a phase shifting mask by a self-aligned technique in which the first level formed, a silicon dioxide layer, serves as a phase shifting layer.

Nakata et al. U.S. Pat. No. 4,906,852, the disclosure of which is incorporated by reference herein, disclose a projection alignment method and apparatus for aligning a mask and a semiconductor wafer through optical imaging. The method and apparatus use a stepped pattern on the semiconductor wafer and a flat portion of the semiconductor wafer and an optical interference system for making the stepped and the flat portions interfere with each other.

Nakata et al. U.S. Pat. No. 4,795,261, the disclosure of which is incorporated by reference herein, disclose a reduction projection system for exposing a circuit pattern through a mask. The system has apparatus for detecting an interference pattern caused by the reflection from a mark on the semiconductor wafer and a reference mirror. The semiconductor wafer mark is under the photoresist and is stepped in the surface of the semiconductor wafer.

Makosch U.S. Pat. No. 4,779,001, the disclosure of which is incorporated by reference herein, discloses the alignment of a semiconductor wafer and a mask using an etched grating pattern on the wafer surface and a corresponding grating on the mask.

Heimer U.S. Pat. No. 4,419,013, the disclosure of which is incorporated by reference herein, discloses a mask alignment system wherein the alignment between successive masks uses alignment targets formed on the semiconductor wafer. The alignment targets on the semiconductor wafer are covered by one or more highly reflective films. To enable the target to be viewed, a phase contrast microscope is used to view the alignment target.

Imahashi U.S. Pat. No. 4,377,028, the disclosure of which is incorporated by reference herein, disclose a method and an apparatus for registering a pattern on a mask with a pattern already formed on a semiconductor wafer. There are reflector groups on the semiconductor wafer and passthrough windows on the mask. Shifting of the mask in the X-Y direction would cause the transmitted light to go from a maximum to a minimum.

None of the above references relate to the image enhancement on a semiconductor wafer by using the existing pattern on the semiconductor wafer. It would be desirable to use the existing pattern on the semiconductor wafer for image enhancement so as to be able to dispense with the use of a mask, alignment marks and all the other apparatus and equipment necessary for mask alignment.

Accordingly, it is one purpose of the present invention to have a method to create a self-aligned resist pattern by using the existing pattern on a semiconductor wafer without using a mask.

It is another purpose of the present invention to have a method to create a self-aligned resist pattern by using the existing pattern on a semiconductor wafer and the pattern of the reticle.

These and other purposes of the present invention will become more apparent after referring to the following description considered in conjunction with the accompanying Figures.

BRIEF SUMMARY OF THE INVENTION

The purposes of the invention have been achieved by providing, according to a first aspect of the invention, a method to self-align a lithographic pattern to a workpiece, the method comprising the steps of:

obtaining a workpiece having a predetermined pattern of features;

modifying at least some of the features so that when a photoresist material is applied to the pattern, there is a substantial difference in reflectivity between two adjacent features, at least one of which has been modified;

applying a photoresist material;

masklessly exposing the photoresist material;

developing said photoresist material, said substantial difference in reflectivity of said two adjacent features causing said developed photoresist material to reveal one adjacent feature but not the other.

According to a second aspect of the invention, there is provided a method to self-align a lithographic pattern to a workpiece, the method comprising the steps of:

obtaining a workpiece having a predetermined pattern of features;

modifying at least some of the features so that when a photoresist material is applied to the pattern, there is a substantial difference in reflectivity between two adjacent features, at least one of which has been modified;

applying a photoresist material;

flood exposing the photoresist material such that the area flood exposed corresponds to at least the two adjacent features in the predetermined pattern of features;

developing said photoresist material, said substantial difference in reflectivity of said two adjacent features causing said developed photoresist material to reveal one adjacent feature but not the other.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

As noted above, it would be extremely desirable to develop technology to self align a pattern to the previously existing pattern on the semiconductor wafer. The present inventors propose to solve the problem by patterning the surface of the semiconductor wafer and optimizing the local resist thickness so that a part of the wafer has higher reflectivity while another part of the semiconductor wafer has lower reflectivity. This modifies the total electrical field in the resist locally according to the pattern on the resist, which results in the self-aligned pattern to the existing pattern on the semiconductor wafer.

Figure 1:
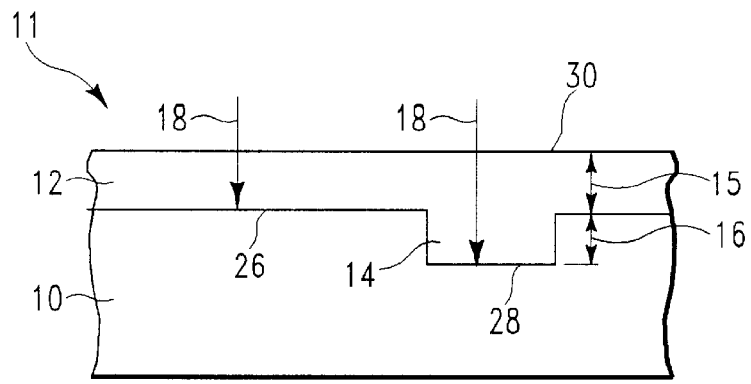
FIG. 1 is a schematic representation of a first embodiment of the invention where the reflectivity of a semiconductor wafer is modified by changing the thickness of the resist locally.

Referring to the Figures in more detail, and particularly referring to FIG. 1, there is shown a schematical representation of the first embodiment of the present invention. The semiconductor wafer 10 with refractive index $n_3$ has a planar surface 26 and at least one feature 14 having a depth 16. It should be understood throughout that planar surface 26 may actually be on the silicon of the semiconductor wafer or on a previously deposited layer. Overlaying the semiconductor wafer 10 is a conventional photoresist 12 with refractive index $n_2$ which also fills feature 14. The environment is indicated by reference number 11 and has a refractive index $n_1$. In order to maximize the delta in reflectivity from surface 26 and surface 28 in feature 14, the resist thickness 15 and the depth 16 of the feature 14 shall be optimized. In some cases, the reflectivity from surface 26 is maximized while the one from surface 28 in feature 14 is minimized. In another case, the reflectivity from surface 26 is minimized while the reflectivity from surface 28 is maximized. Preferably, the refractive indices of $n_1$, $n_2$ and $n_3$ should be optimized to maximize the amplitude of the swing curve.

The beam intensity in the resist from the incident beam 18 is higher for the area where the reflectivity is smaller, while it is lower for the area where the reflectivity is higher. Accordingly, the photoresist 12 exposed to the incident beam 18 is developed with the pattern associated with the one on the semiconductor wafer 10.

Figure 11:
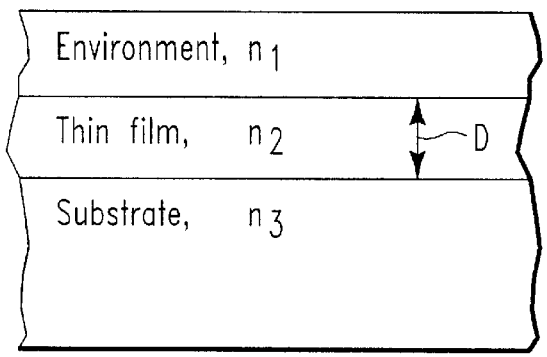
FIG. 11 is a schematical illustration of a substrate with a thin film showing the indices of refraction of the substrate, thin film and environment.

By applying the thin film optics equation for normally incident plane wave of illumination, the reflectivity R of the one layer thin film on the substrate (as shown in FIG. 11) is provided by the following equation:

$$R = \{|\rho_{12}|^2 + |\rho_{23}|^2 e^{-\alpha 2D} + 2|\rho_{12}\rho_{23}|e^{-\alpha D}\cos(4\pi n_2 D/\lambda)\}/\{1+|\rho_{12}\rho_{23}|^2 e^{-\alpha 2D}+2|\rho_{12}\rho_{23}|e^{-\alpha D}\cos(4\pi n_2 D/\lambda)\} \quad (1)$$

where:

n=n−iκ: the complex index of refraction

α=4πκ/λ: the absorption coefficient, λ is the wave length $\rho_{ij}=(n_i-n_j)/(n_i+n_j)$: the reflection coefficient D: thickness of the thin film (corresponding to the resist thickness in this disclosure.)

Figure 12:
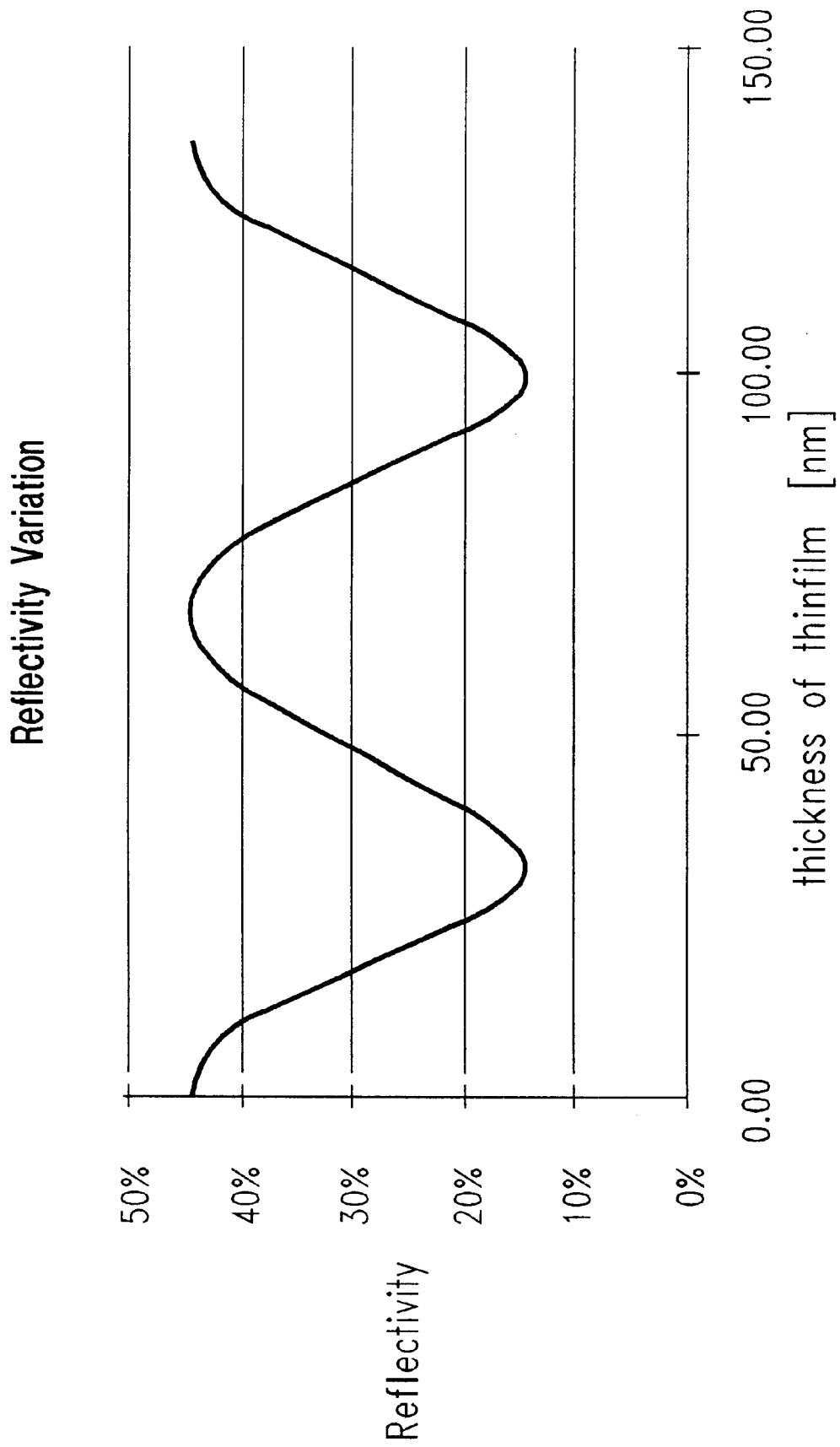
FIG. 12 is a graph of the reflectivity of a thin film.

FIG. 12 shows one example of the reflectivity of a thin film calculated with equation (1), with $n_1=1, n_2=1.5, n_3=5$, α=0, and λ=193 nm., as a function of the resist thickness D (corresponding to reference number 15 in FIG. 1). As is shown in FIG. 12, the reflectivity from the resist can be maximized/minimized by optimizing D according to the refractive indices of the materials and the incident beam wave length.

Figure 10:
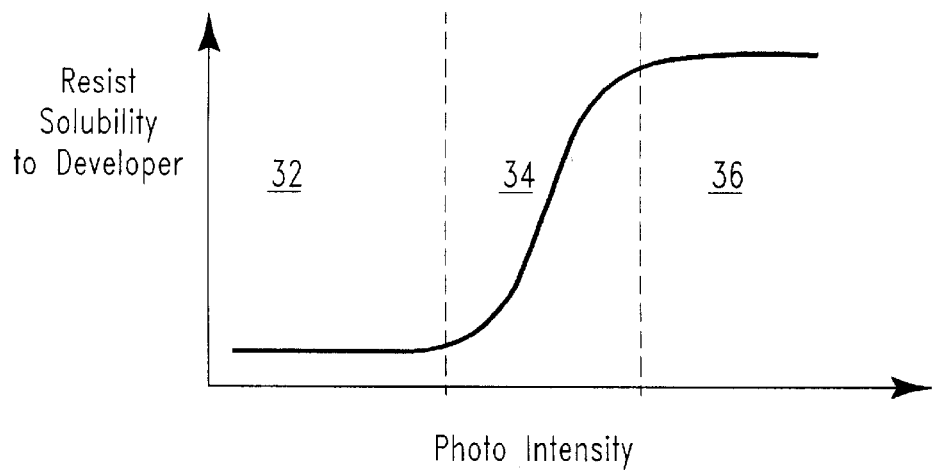
FIG. 10 is a graph of the solubility of the resist in the developer as a function of the photon intensity.

Referring now to FIG. 10, the solubility of a resist to developer is graphed versus the photon intensity in the resist. Beam intensity in the resist is less for higher reflectivity. In area 32 of the graph, the photon intensity is insufficient to cause any change in the resist solubility; therefore, the resist remains unchanged. In area 34 of the graph, the photon intensity causes some change in the resist solubility. Lastly, in area 36 of the graph, the photon intensity changes the resist solubility of the resist.

In the case of a negative resist, a photon intensity within area 32 would cause very little or no change in the resist solubility. This is corresponding to the area with higher reflectivity. Thus, upon exposure to the developer, the resist would be removed. However, if photon intensity was within area 36, the lower reflectivity area, the resist solubility would be greatly changed such that the resist would become insoluble.

The choice of photoresist should be made so that a photoresist having the right sensitivity to the incident beam is chosen and the curve shown in FIG. 10 is optimized. A positive photoresist would also work with the present invention except that where reflectivity is the lowest, the photoresist would be removed.

Referring to FIGS. 1, 10, and 12, the resist will remain in self-aligned manner by optimizing the resist thickness 15, step height 16, and illumination intensity of the incident beam 18 for the material refractive indices in the system. The key condition is to set the beam intensity in the resist over surfaces 26, 28 in FIG. 1 to be the areas 32, 36 of FIG. 10, respectively. Another combination is the intensity of surfaces 26, 28 to be the areas 36, 32 of FIG. 10, respectively.

In the case of the embodiment shown as FIG. 1, the resist thickness 15 is optimized to get the maximum reflectivity for the surface 26, and step height 16 is optimized to get the minimum reflectivity for surface 28. For a positive resist, the resist on surface 28 is exposed and dissolved in the developer, while the resist on surface 26 is not exposed enough and remains after being developed.

Still referring to FIG. 1, the reflectivity of surface 26 can be minimized by changing the applied resist thickness. In this case, the reflectivity of surface 28 should be maximized with the step height 16.

Figure 3A:
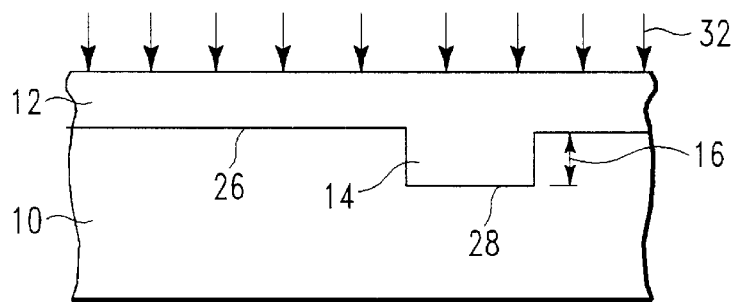
FIGS. 3A and 3B are partial cross sections of a semiconductor wafer implementing the first embodiment of the invention.
Figure 3B:
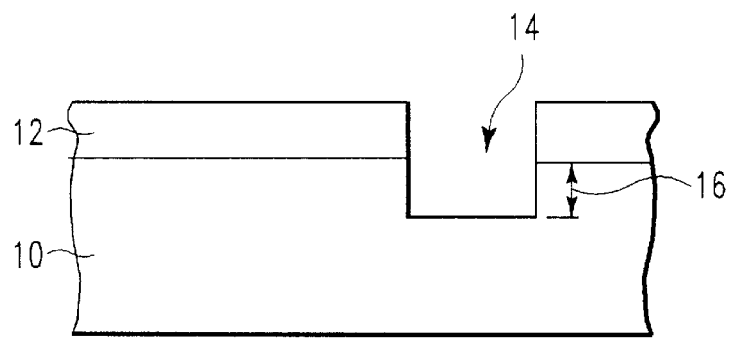

An implementation of the present invention is illustrated in FIG. 3A. There, semiconductor wafer 10 has a suitable positive photoresist 12 overlaid on it. Semiconductor wafer 10 has a recessed feature 14 of depth 16 containing the photoresist. The depth 16 of feature 14 is chosen so that there is a substantial difference in reflectivity between surface 26 and feature 14. By substantial difference in reflectivity, it should be understood that this means that the reflectivity of low reflective areas (e.g., surface 28) should cause a change in the resist solubility while the reflectivity in the high reflective areas (e.g., surface 26) will cause little or no change in the resist solubility. The semiconductor wafer 10 and photoresist 12 are exposed to a flood beam 32 of incident radiation, which can be a coherent source such as a laser or other suitable source of photons such as a narrowband light source (e.g., low pressure metal (e.g., Hg) vapor lamps). No mask is used. After photoresist 12 is developed post-exposure, the resultant structure is shown in FIG. 3B, wherein the photoresist over feature 14 has been dissolved in the developer. The resulting structure shown in FIG. 3B is self aligned. Further processing of the semiconductor wafer can now take place including etching and implantation.

Referring again to FIG. 10, since there only needs to be a relative change in resist solubility, there need not be zero reflectivity. That is, high reflectivity areas have less photons in the photoresist meaning less change in solubility of the photoresist. Similarly, low reflectivity areas have more photons in the photoresist meaning more change in solubility of the photoresist. Such a relationship allows for a wide process window.

Figure 2:
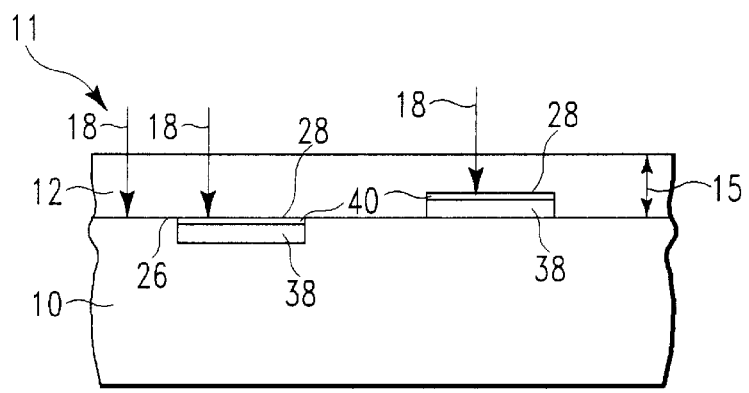
FIG. 2 is a schematic representation of a second embodiment of the invention where the reflectivity of a semiconductor wafer is modified by locally filling, or locally adding, a material that absorbs the incident photons without or with very small reflection.

Referring now to FIG. 2, there is shown a second embodiment of the invention. Semiconductor wafer 10 has recessed feature 40, where the incident beam is absorbed. Recessed feature 40 overlies material 38. Recessed feature 40 can be a nitride (e.g., silicon nitride), an oxynitride (e.g., silicon oxynitride), amorphous Si:C:H (amorphous SiC), amorphous C:H (amorphous carbon, also referred to as diamond-like carbon) or any organic/inorganic material with optical absorption at the energy level of the incident beam, and with lower refractive index by itself to avoid any reflection between the photoresist 12 and underlying material 38. For organic material, a conventional anti-reflective coating (ARC) material can be used here. Recessed feature 40 need not be level with surface 26. That is, as shown in FIG. 2, recessed feature 40/material 38 may be recessed within semiconductor wafer 10 (as shown on the left of FIG. 2) or within a layer overlying the semiconductor wafer (as shown on the right of FIG. 2). Overlying the semiconductor wafer 10 and recessed feature 38 is a photoresist 12. The environment is indicated by reference number 11. Incident beam 18, which again could be a coherent light source such as a laser or other suitable light source such as a narrowband light source, impinges upon photoresist 12 and semiconductor wafer 10. While shown as separate features, recessed feature 40/material 38 can actually be a single feature/material such as silicon nitride.

In the embodiment of the present invention illustrated in FIG. 2, the resist thickness 15 shall be adjusted so that the photoresist of surface 26 has the maximum reflectivity. By doing so, the photoresist 12 on surface 26 absorbs less energy from the incident beam 18, while the photoresist 12 on surface 28 is exposed and changed its solubility to the developer.

Figure 4A:
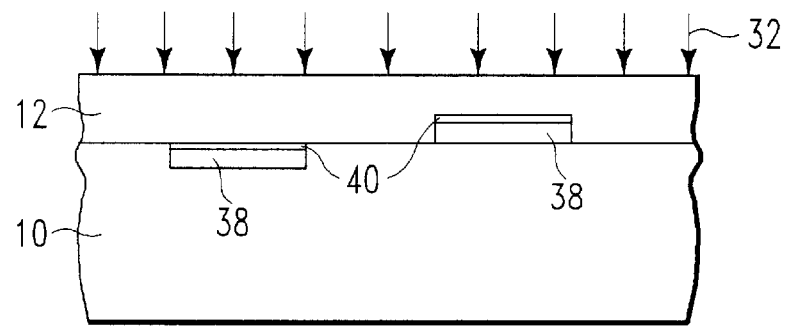
FIGS. 4A and 4B are partial cross sections of a semiconductor wafer implementing the second embodiment of the invention.
Figure 4B:
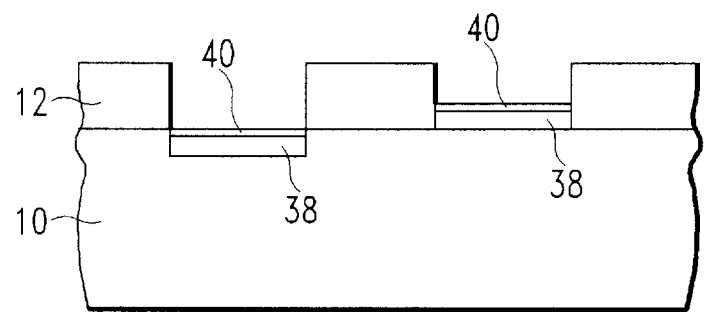

Assuming again a positive photoresist, and referring again to FIG. 10, a low reflective surface would cause a change in the photoresist solubility, thereby causing the photoresist to remain over surface 26 as shown in FIG. 4B.

The implementation of the second embodiment of the invention is shown in FIGS. 4A and 4B. Semiconductor wafer 10 has recessed feature 40, such as a nitride, overlying material 38. In the case where recessed feature 40/material 38 are in the wafer 10 (shown on the left of FIG. 4A), the substrate material which may be aluminum is recessed. An ARC material is deposited and then etched back to surface 26. Preferably, the ARC shall have a refractive index similar to the photoresist so that the reflection from the interface is minimized. In the case where recessed feature 40/material 38 are on the wafer 10, material 38 can be a gate stack and recessed layer can be a silicon nitride layer.

A suitable photoresist 12, for example a positive photoresist, is deposited onto semiconductor wafer 10. The semiconductor wafer 10 and photoresist 12 are exposed to a flood beam 32 of incident radiation. After photoresist 12 is developed post-exposure, the resultant structure is shown in FIG. 4B, wherein the photoresist over recessed feature 38 has been dissolved in the developer. The resulting structure shown in FIG. 4B is self aligned. Further processing of the semiconductor wafer can now take place including depositing various materials (e.g., metal, oxide, and nitride materials) over layer 40 in a conventional manner. It is also possible to remove layer 40 by, for example, a dry etch process and then deposit another material if the absorbing layer 40 would be unsuitable for operation of the final circuit design.

It should be apparent that the first and second embodiments can be combined on any given semiconductor wafer.

Figure 5:
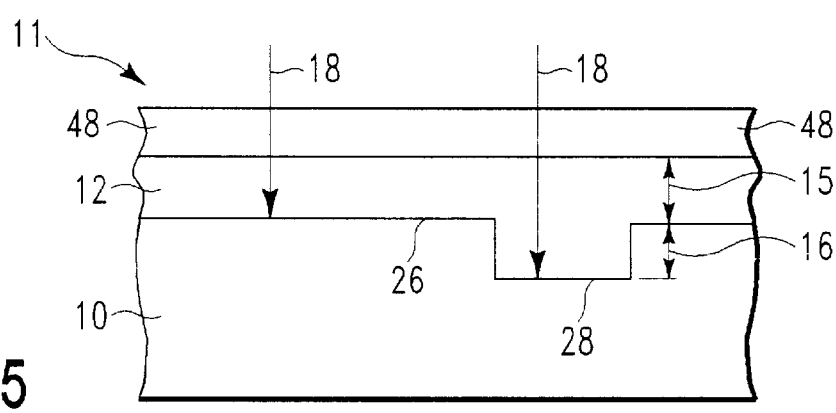
FIG. 5 is a partial cross section of a semiconductor wafer implementing a variation of the first embodiment of the invention wherein a half reflector is utilized.
Figure 6:
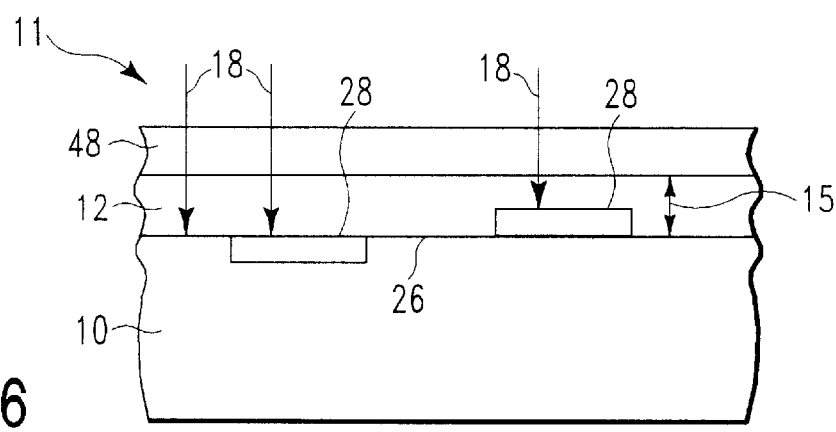
FIG. 6 is a partial cross section of a semiconductor wafer implementing a variation of the second embodiment of the invention wherein a half reflector is utilized.

Referring now to FIG. 5, there is shown a variation of the first embodiment of the invention. In this embodiment of the invention, photoresist 12 has an overlying half reflector layer 48 (i.e., a top ARC). The purpose of the half reflector layer 48 is to control reflection from the $n_1/n_2$ interface (as defined in FIG. 11) so that the reflection from the interface can be maximized when the resist refractive index ($n_2$) is close to the one of the environment ($n_1$). Half reflectors would be implemented as developer soluble, organic coatings with the layer thickness and refractive index adjusted to achieve approximately 50% reflectivity. One suitable half reflector material is NFC540, available from JSR. The half reflector layer 48 could also be used to the same advantage with respect to the second embodiment of the invention as shown in FIG. 6.

Figure 7:
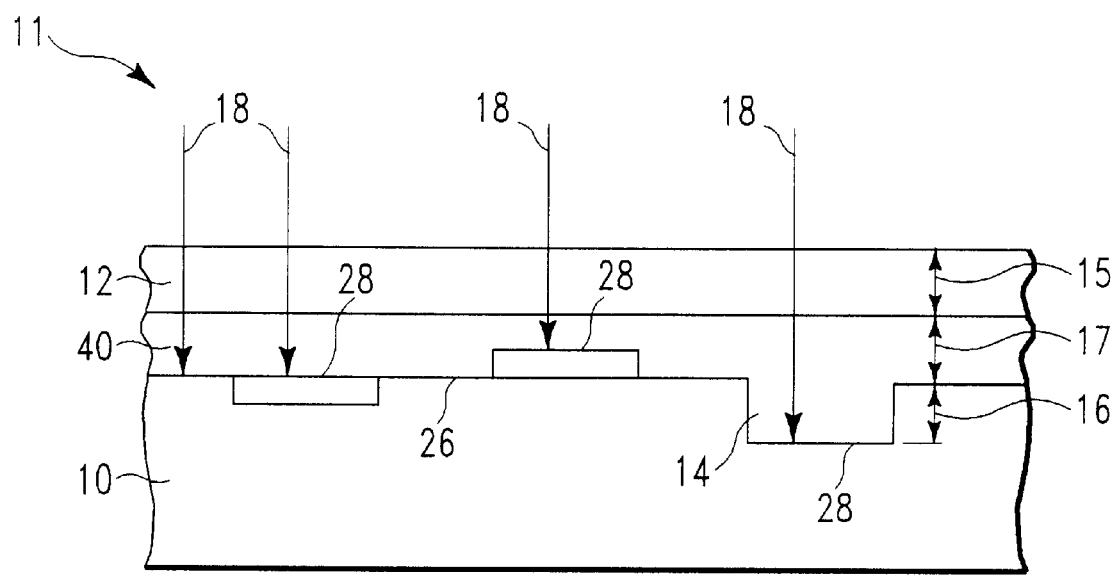
FIG. 7 is a partial cross section of a semiconductor wafer implementing a further variation of the first and second embodiments of the invention wherein a transparent layer is added between the substrate and the resist.
Figure 8:
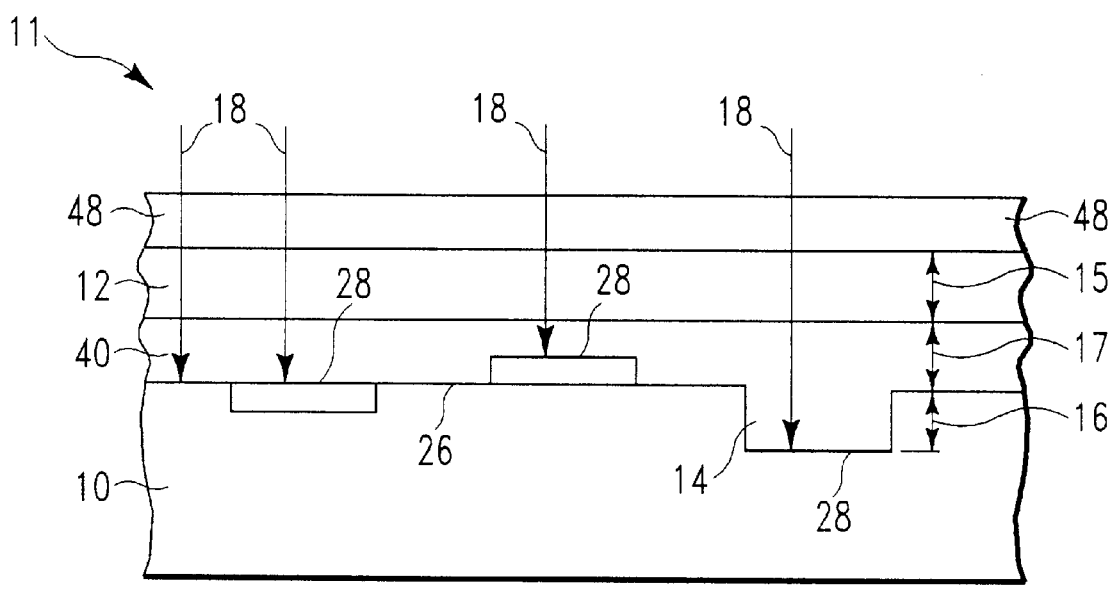
FIG. 8 is a partial cross section of a semiconductor wafer implementing a further variation of the first and second embodiments of the invention wherein a transparent layer is added between the substrate and the resist and a half reflector is utilized.

As shown in FIG. 7, the first and second embodiments of the invention are shown in combination with a transparent layer 40 with the refractive index $n_4$. As shown in FIG. 8, the first and second embodiments of the invention are shown in combination with both a transparent layer 40 and a half reflector 48. $n_4$ should be close to $n_2$, the refractive index of photoresist 12, so that no or very small rflection occurs at the interface between the photoresist 12 and the transparent layer 40. An example of the transparent layer 40 is an interlayer dielectric of $SiO_2$. It is preferable that the surface of the transparent layer 40 is polished so that the transparent layer 40 has a flat surface. Because of the small amount of reflection at the interface between the transparent layer 40 and photoresist 12, the difference in reflectivity at the photoresist surface between surfaces 26 and 28 can be obtained.

If the effect of the reflection from the interface between the transparent layer 40 and photoresist 12 cannot be ignored, equation (1) shall be modified for a four layer model to obtain the optimized refractive indices and thicknesses of photoresist 12, transparent layer 40 and depth 16 of feature 14.

Note that this transparent layer 40 can be a stacked layer of multiple films, so long as the resulting reflectivity of the surfaces 26 and 28 has substantial difference to develop the photoresist 12 locally according to the difference in reflectivity.

It should be understood that the embodiments shown in FIGS. 7 and 8 are examples only and are not meant to be limiting in that more than two or three layers may be used. The important feature to be obtained is surfaces with two different reflectivities so that the photoresist 12 is locally developed by using the reflectivity difference.

Figure 9:
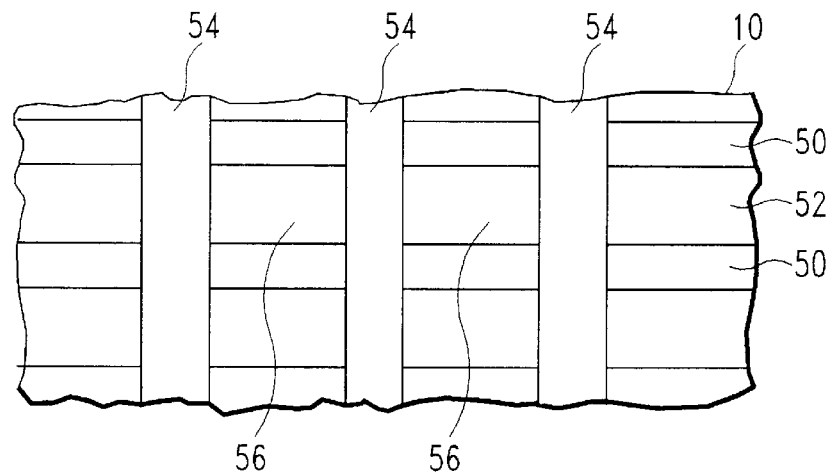
FIG. 9 is a plan view of a semiconductor wafer according to the present invention and further including a mask.

Referring now to FIG. 9, there is shown a further embodiment of the present invention. A portion of a semiconductor wafer 10 is shown having metal stripes 50 separated by nonmetallic open areas 52. Metal stripes 50 and nonmetallic open areas 52 are modified as discussed above so as to give a substantial difference in reflectivity. In addition, mask 54 is placed over the semiconductor wafer 10 so as to define areas 56. If area 56 is further defined as the target feature, the mask openings should be at least slightly larger than the target features so as to take advantage of the self alignment obtained by the present invention. The mask opening is only slightly larger than the target feature so as to get the benefit of the difference in reflectivity between the target feature and the area adjacent to the target feature. By using the principles of the present invention, the difference in reflectivity between features 50 and 52, in conjunction with mask 54, allows the depositing and patterning of a photoresist so as to define areas 56. Such a variation of the present invention would be useful in making contact holes and the like.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method to self-align a lithographic pattern to a workpiece, the method comprising obtaining a workpiece having a predetermined pattern of features;

modifying at least some of the features so that when a photoresist material is applied to the pattern, there is a substantial difference in reflectivity between two adjacent features, at least one of which has been modified;

applying a photoresist material to the pattern in a predetermined thickness according to at least the refractive index of the photoresist and a wavelength of an incident beam that exposes the photoresist material;

masklessly exposing the photoresist material with an incident beam of light;

developing said photoresist material, said substantial difference in reflectivity of said two adjacent features causing said developed photoresist material to reveal one adjacent feature but not the other.

2. The method of claim 1 wherein the step of modifying comprises applying a material that is absorbing with respect to an incident beam used to expose the photoresist material and the step of applying a photoresist material includes applying a photoresist material to the pattern in a predetermined thickness according to at least the refractive index of the photoresist and the refractive index of the absorbing material.

3. The method of claim 2 wherein the absorbing material is selected from the group consisting of nitrides, amorphous C:H, amorphous Si:C:H and oxynitrides.

4. The method of claim 2 further comprising the step of removing the absorbing material after the step of developing.

5. The method of claim 1 wherein the step of modifying comprises recessing at least one of the modified features a predetermined amount with respect to the adjacent unmodified feature.

6. The method of claim 1 further comprising applying a half-reflector material over the photoresist prior to the step of masklessly exposing.

7. The method of claim 1 wherein an incident beam of electromagnetic radiation used in the step of masklessly exposing is selected from the group consisting of lasers and narrowband light sources.

8. A method to self-align a lithographic pattern to a workpiece, the method comprising the steps of:

obtaining a workpiece having a predetermined pattern of features;

modifying at least some of the features so that when a photoresist material is applied to the pattern, there is a substantial difference in reflectivity between two adjacent features, at least one of which has been modified;

applying a photoresist material to the pattern in a predetermined thickness according to at least the refractive index of the photoresist and a wavelength of an incident beam that exposes the photoresist material;

flood exposing the photoresist material with an incident beam of light such that an area flood exposed corresponds to at least the two adjacent features in the predetermined pattern of features;

developing said photoresist material, said substantial difference in reflectivity of said two adjacent features causing said developed photoresist material to reveal one adjacent feature but not the other.

9. The method of claim 8 wherein the step of modifying comprises applying a material that is absorbing with respect to an incident beam used to expose the photoresist material and the step of applying a photoresist material includes applying a photoresist material to the pattern in a predetermined thickness according to at least the refractive index of the photoresist and the refractive index of the absorbing material.

10. The method of claim 9 wherein the absorbing material is selected from the group consisting of nitrides, amorphous C:H, amorphous Si:C:H and oxynitrides.

11. The method of claim 9 further comprising the step of removing the absorbing material after the step of developing.

12. The method of claim 8 wherein the step of modifying comprises recessing at least one of the modified features a predetermined amount with respect to the adjacent unmodified feature.

13. The method of claim 8 further comprising applying a half-reflector material over the photoresist prior to the step of flood exposing.

14. The method of claim 8 wherein an incident beam of electromagnetic radiation used in the step of flood exposing is selected from the group consisting of lasers and narrow-band light sources.

15. The method of claim 8 wherein one of the two adjacent features is a target feature and further comprising applying a mask prior to flood exposing, the mask having openings which are larger than the size of the target feature.

16. A method to self-align a lithographic pattern to a workpiece, the method comprising the steps of:

obtaining a workpiece having a predetermined pattern of features;

modifying at least some of the features so that when a photoresist material is applied to the pattern, there is a substantial difference in reflectivity between two adjacent features, at least one of which has been modified;

applying a transparent material to the pattern of features;

applying a photoresist material to the transparent material in a predetermined thickness according to at least the refractive index of the photoresist and the retractive index of the transparent material and a wavelength of an incident beam that exposes the photoresist material;

masklessly exposing the photoresist material with an incident beam of light;

developing said photoresist material, said substantial difference in reflectivity of said two adjacent features causing said developed photoresist material to reveal one adjacent feature but not the other.

17. The method of claim 16 wherein the refractive index of the photoresist and the retractive index of the transparent material are similar so that no or very small reflection occurs at the interface between the photoresist and the transparent layer.

18. The method of claim 16 wherein the transparent material is silicon dioxide.

19. A method to self-align a lithographic pattern to a workpiece, the method comprising the steps of:

obtaining a workpiece having a predetermined pattern of features;

modifying at least some of the features so that when a photoresist material is applied to the pattern, there is a substantial difference in reflectivity between two adjacent features, at least one of which has been modified;

applying a transparent material to the pattern of features;

applying a photoresist material to the transparent material in a predetermined thickness according to at least the refractive index of the photoresist and the retractive index of the transparent material and a wavelength of an incident beam that exposes the photoresist material;

flood exposing the photoresist Material with an incident beam of light such that an area flood exposed corresponds to at least the two adjacent features in the predetermined pattern of features;

developing said photoresist material, said substantial difference in reflectivity of said two adjacent features causing said developed photoresist material to reveal one adjacent feature but not the other.

20. The method of claim 19 wherein the refractive index of the photoresist and the retractive index of the transparent material are similar so that no or very small reflection occurs at the interface between the photoresist and the transparent layer.

21. The method of claim 19 wherein the transparent material is silicon dioxide.

* * * * *